United States Patent
Ashworth

(10) Patent No.: US 9,537,455 B2
(45) Date of Patent: Jan. 3, 2017

(54) MULTIPLEX DETECTOR SIGNAL BOOSTERS

(71) Applicant: Wilson Electronics, LLC, St. George, UT (US)

(72) Inventor: Christopher Ken Ashworth, St. George, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 14/683,960

(22) Filed: Apr. 10, 2015

(65) Prior Publication Data

US 2016/0301371 A1    Oct. 13, 2016

(51) Int. Cl.
| | |
|---|---|
| *H04B 7/15* | (2006.01) |
| *H03F 3/21* | (2006.01) |
| *H04B 1/40* | (2015.01) |
| *H03F 3/19* | (2006.01) |

(52) U.S. Cl.
CPC .............. *H03F 3/211* (2013.01); *H03F 3/19* (2013.01); *H04B 1/40* (2013.01); *H03F 2200/451* (2013.01); *H03F 2203/21109* (2013.01)

(58) Field of Classification Search
CPC .................................. H04B 7/14; H04B 7/15
USPC ............................................................ 455/7
See application file for complete search history.

(56) References Cited

U.S. PATENT DOCUMENTS

| | | | |
|---|---|---|---|
| 5,245,347 A | 9/1993 | Bonta et al. | |
| 5,377,255 A | 12/1994 | Beasley | |
| 5,689,801 A | 11/1997 | Frichtel et al. | |
| 5,835,848 A | 11/1998 | Bi et al. | |
| 6,032,020 A | 2/2000 | Cook et al. | |
| 7,729,656 B2 * | 6/2010 | Van Buren | H04B 7/15542 370/315 |
| 8,005,513 B2 * | 8/2011 | Risheq | H04B 7/15535 455/571 |
| 9,119,061 B2 * | 8/2015 | Mohamadi | H04W 16/26 |

(Continued)

FOREIGN PATENT DOCUMENTS

KR    1020150010812 A    1/2015

OTHER PUBLICATIONS

"Design of Downlink and Uplink timeslots switch of the TD-SCDMA wireless repeater", Jin He and Sijiu Wu, Antennas, Propagation and EM Thory, 2008. ISAPE 2008. 8th International Symposium, pp. 1486-1489.

(Continued)

*Primary Examiner* — Blane Jackson
(74) *Attorney, Agent, or Firm* — Thorpe North & Western

(57) ABSTRACT

A signal booster may include a first path that may include a first tap circuit. The first path may be coupled between a first port and a second port and may be configured to amplify a first signal. The signal booster may also include a second path that includes a second tap circuit. The second path may be coupled between the first port and the second port and may be configured to amplify a second signal. The signal booster may also include a radio frequency detector circuit and a switch circuit. The switch circuit may be configured to switch between coupling the radio frequency detector circuit to the first tap circuit and coupling the radio frequency detector circuit to the second tap circuit to provide either a portion of the first signal or a portion of the second signal to the radio frequency detector circuit.

20 Claims, 6 Drawing Sheets

(56) References Cited

U.S. PATENT DOCUMENTS

| | | |
|---|---|---|
| 2003/0045230 A1 | 3/2003 | Weissman |
| 2004/0176026 A1* | 9/2004 | Gainey .................. H04B 7/155 |
| | | 455/7 |
| 2006/0019603 A1 | 1/2006 | Pergal |
| 2006/0063484 A1 | 3/2006 | Proctor, Jr. et al. |
| 2006/0195883 A1 | 8/2006 | Proctor, Jr. et al. |
| 2007/0202826 A1 | 8/2007 | Dean |
| 2007/0218951 A1 | 9/2007 | Risheq et al. |
| 2010/0061280 A1 | 3/2010 | Lee |
| 2010/0120356 A1* | 5/2010 | Jin .................... H04B 7/15535 |
| | | 455/7 |
| 2010/0284446 A1 | 11/2010 | Mu et al. |
| 2011/0085477 A1 | 4/2011 | Schiff |
| 2012/0099490 A1 | 4/2012 | Kummetz et al. |
| 2013/0203403 A1 | 8/2013 | Cook et al. |
| 2013/0210500 A1 | 8/2013 | Graham et al. |
| 2014/0065949 A1 | 3/2014 | Wilhite |
| 2015/0011157 A1 | 1/2015 | Terry |

OTHER PUBLICATIONS

"New Auto-Attenuator Controller for WLAN 802.11 b/g Repeater in WAP", Jacky Dai et al., Integration Technology, 2007. IEEE International Conference pp. 474-477.

"Coexistence of 3G Repeaters with LTE Base Stations", Woon-Young Yeo et al. The Scientific World Journal, 2013, Electronic Publication Date Dec. 29, 2013.

"Multi-band Pico Repeater—UMTS850, GSM900, DCS1800, WCDMA2100 and LTE2600", http://www.zdwsys.com/EN%20v1.3/pro_pico.htm, retrieved on Mar. 20, 2015.

\* cited by examiner

MULTIPLEX DETECTOR SIGNAL BOOSTERS

FIELD

The embodiments discussed herein are related to multiplex detector signal boosters.

BACKGROUND

In a wireless communication system, communication may occur as uplink communications and downlink communications. Uplink communications may refer to communications that originate at a wireless communication device (referred to hereinafter as "wireless device") and that are transmitted to an access point (e.g., base station, remote radio head, wireless router, etc.) associated with the wireless communication system. Downlink communications may refer to communications from the access point to the wireless device.

Sometimes a wireless device in a wireless communication system may be positioned such that it may not receive uplink and/or downlink communications from an access point at a desired power level. In these situations, a user of the wireless device may employ a signal booster to boost the uplink and/or downlink communications.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of one or more embodiments, a signal booster may include a first amplification path that may include a first tap circuit. The first amplification path may be coupled between a first port and a second port and may be configured to amplify a first signal in a wireless communication network. The signal booster may also include a second amplification path that may include a second tap circuit. The second amplification path may be coupled between the first port and the second port and may be configured to amplify a second signal in the wireless communication network. The signal booster may also include a radio frequency detector circuit and a switch circuit. The switch circuit may be coupled to the first tap circuit, to the second tap circuit, and to the radio frequency detector circuit. The switch circuit may be configured to switch between coupling the radio frequency detector circuit to the first tap circuit and coupling the radio frequency detector circuit to the second tap circuit to provide either a portion of the first signal or a portion of the second signal to the radio frequency detector circuit.

According to an aspect of one or more embodiments, a signal booster is disclosed that may include a first port and a second port. The signal booster may also include a first uplink amplification path that may include a first uplink tap circuit. The first uplink amplification path may be coupled between the first port and the second port and may be configured to pass a first uplink signal of a first frequency in a wireless communication network. The signal booster may also include a second uplink amplification path that includes a second uplink tap circuit. The second uplink amplification path may be coupled between the first port and the second port and may be configured to pass a second uplink signal of a second frequency in the wireless communication network.

The signal booster may also include an uplink radio frequency detector circuit and an uplink switch circuit coupled to the first uplink tap circuit, to the second uplink tap circuit, and to uplink radio frequency detector circuit. The uplink switch circuit may be configured to switch between coupling the uplink radio frequency detector circuit to the first uplink tap circuit and coupling the uplink radio frequency detector circuit to the second uplink tap circuit to provide either a portion of the first uplink signal or a portion of the second uplink signal to the uplink radio frequency detector circuit.

The signal booster may also include a first downlink amplification path that includes a first downlink tap circuit. The first downlink amplification path may be coupled between the first port and the second port and may be configured to pass a first downlink signal of a third frequency in the wireless communication network. The signal booster may also include a second downlink amplification path that includes a second downlink tap circuit. The second downlink amplification path may be coupled between the first port and the second port and may be configured to pass a second downlink signal of a fourth frequency in the wireless communication network.

The signal booster may also include a downlink radio frequency detector circuit and a downlink switch circuit coupled to the first downlink tap circuit, to the second downlink tap circuit, and to the downlink radio frequency detector circuit. The downlink switch circuit may be configured to switch between coupling the downlink radio frequency detector circuit to the first downlink tap circuit and coupling the downlink radio frequency detector circuit to the second downlink tap circuit to provide either a portion of the first downlink signal or a portion of the second downlink signal to the downlink radio frequency detector circuit.

According to an aspect of one or more embodiments, a method is disclosed that includes amplifying a first signal in a first amplification path coupled between a first port and a second port of a signal booster. The method also includes amplifying a second signal in a second amplification path coupled between the first port and the second port of the signal booster. The method also includes coupling a radio frequency detector to the first amplification path to detect a power level of the first signal. The method also include decoupling the radio frequency detector from the first amplification path and coupling the radio frequency detector to the second amplification path to detect a power level of the second signal.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to one or more embodiments, a signal booster may include a first port and a second port. The first port may be coupled to an outside antenna that is configured to receive downlinks signals from a wireless communication access point, such as a base station or remote radio head, and to transmit uplink signals to a wireless communication access point. The second port may be coupled to an inside antenna that is configured to receive uplink signals from a wireless device, such as a cellular phone or tablet, and to transmit downlink signals to the wireless device. The signal booster may include a first amplification path that includes a first tap circuit. The first amplification path may be coupled between the first port and the second port and may be configured to amplify the downlink signals. The signal booster may further include a second amplification path that includes a second tap circuit. The second amplification path may be coupled between the first port and the second port and may be configured to amplify the uplink signals.

The signal booster may further include a radio frequency detector circuit and a switch circuit coupled to the first tap circuit, to the second tap circuit, and to the radio frequency detector circuit. The switch circuit may be configured to switch between coupling the radio frequency detector circuit to the first tap circuit and coupling the radio frequency detector circuit to the second tap circuit to provide either a portion of the downlink signal or a portion of the uplink signal to the radio frequency detector. The radio frequency detector may provide an indication of the strength of the downlink signal and the strength of the uplink signal to a control unit.

The control unit may be configured to control the amplification applied by the first and second amplification paths to the downlink and uplink signals, respectively. In this manner, the signal booster may adjust the amplification of the downlink and uplink signals for any reasons, such as to reduce antenna-to-antenna and internal oscillations, to boost signal strength, to reduce a noise floor at the wireless communication access point, among other reasons. By switching between coupling the radio frequency detector circuit to the first tap circuit and coupling the radio frequency detector circuit to the second tap circuit, the signal booster may reduce a number of radio frequency detector circuits in the signal booster. Reducing the number of radio frequency detector circuits may reduce cost, decrease size, and may provide other benefits as well.

Figure 1:
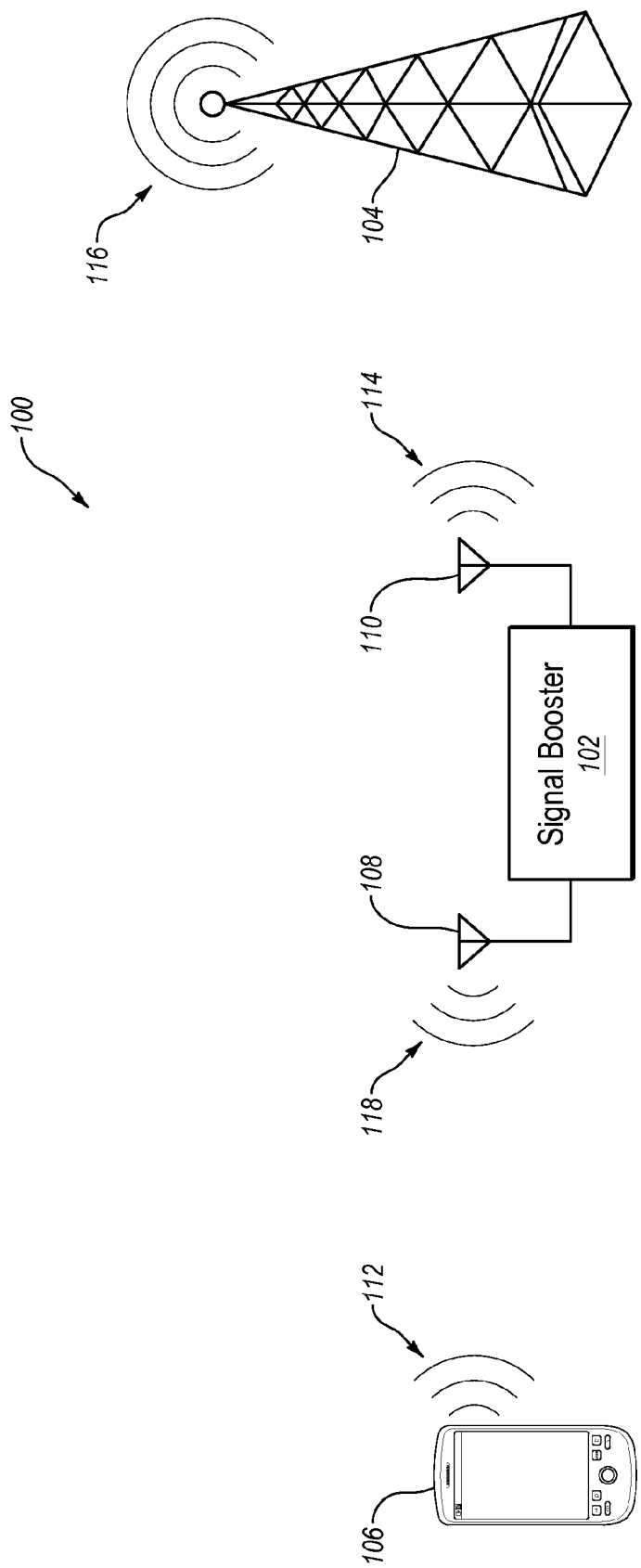
FIG. 1 illustrates an example wireless communication system.

FIG. 1 illustrates an example wireless communication system 100 (referred to hereinafter as "system 100"), arranged in accordance with at least some embodiments described in this disclosure. The system 100 may be configured to provide wireless communication services to wireless devices, such as a wireless device 106 via an access point 104. The system 100 may further include a bidirectional signal booster 102 (referred to hereinafter as "the signal booster 102"). The signal booster 102 may be any suitable system, device, or apparatus configured to receive wireless signals (e.g., radio frequency (RF) signals communicated in one or more frequency bands) communicated between the access point 104 and the wireless device 106. The signal booster 102 may be configured to amplify, mute, repeat, filter, and/or otherwise process the received wireless signals and may be configured to re-transmit the processed wireless signals. Although not expressly illustrated in FIG. 1, the system 100 may include any number of access points 104 configured to provide wireless communication services to any number of wireless devices 106. In these and other embodiments, the signal booster 102 may communicated wireless signals from multiple access points 104 to multiple different wireless devices 106, from a single access point 104 to multiple different wireless devices 106, or from multiple access points 104 to one wireless device 106.

The wireless communication services provided by the system 100 may include voice services, data services, messaging services, and/or any suitable combination thereof. The system 100 may include a Frequency Division Duplexing (FDD) network, a Frequency Division Multiple Access (FDMA) network, an Orthogonal FDMA (OFDMA) network, a Code Division Multiple Access (CDMA) network, a Time Division Multiple Access (TDMA) network, a Direct Sequence Spread Spectrum (DSSS) network, a Frequency Hopping Spread Spectrum (FHSS) network, and/or some other wireless communication network. In some embodiments, the system 100 may be configured to operate as a second generation (2G) wireless communication network, a third generation (3G) wireless communication network, a fourth generation (4G) wireless communication network, a Wi-Fi network, or some other communication network. In these or other embodiments, the system 100 may be configured to operate as a Long Term Evolution (LTE) or LTE Advanced wireless communication network.

The access point 104 may be any suitable wireless network communication point and may include, by way of example but not limitation, a base station, a remote radio head (RRH), a satellite, a wireless router, or any other suitable communication point. The wireless device 106 may be any device that may use the system 100 to obtain wireless communication services and may include, by way of example and not limitation, mobile access terminals, such as a cellular phone, a smartphone, a personal data assistant (PDA), a laptop computer, a tablet computer, among others; non-mobile access terminals, such as a personal computer, a wireless router, a modem, among others; or any other similar device configured to communicate within the system 100.

As wireless signals propagate between the access point 104 and the wireless device 106, the wireless signals may be affected during the propagation such that, in some instances, the wireless signals may be substantially degraded. The signal degradation may result in the access point 104 or the wireless device 106 not receiving, detecting, or decoding information from the wireless signals. Therefore, the signal booster 102 may be configured to increase the power of and/or improve the signal quality of the wireless signals such that the communication of the wireless signals between the access point 104 and the wireless device 106 may be improved.

In some embodiments, the signal booster 102 may receive a wireless signal communicated between the access point 104 and the wireless device 106 and may convert the wireless signal into an electrical signal (e.g., via an antenna). The signal booster 102 may be configured to amplify the electrical signal and the amplified electrical signal may be converted into an amplified wireless signal (e.g., via an antenna) that may be transmitted. The signal booster 102 may amplify the electrical signal by applying a gain to the electrical signal. The gain may be a set gain or a variable gain, and may be less than, equal to, or greater than one. Therefore, in the present disclosure, the term "amplify" may refer to applying any gain to a wireless signal including gains that are less than one.

In some embodiments, the signal booster 102 may adjust the gain based on conditions associated with communicating the wireless signals (e.g., providing noise floor protection in the system 100, internal oscillation of the signal booster 102, external oscillation (e.g., antenna to antenna oscillations) of the signal booster 102, and/or overload protection at the access point 104). In these and other embodiments, the signal booster 102 may adjust the gain in real time. The signal booster 102 may also filter out noise associated with the received wireless signal such that the retransmitted wireless signal may be a cleaner signal than the received wireless signal. Therefore, the signal booster 102 may improve the communication of wireless signals between the access point 104 and the wireless device 106.

For example, the wireless device 106 may communicate a wireless uplink signal 112 intended for reception by the access point 104 and a first antenna 108 may be configured to receive the wireless uplink signal 112. The first antenna 108 may be configured to convert the received wireless uplink signal 112 into an electrical uplink signal. Additionally, the first antenna 108 may be communicatively coupled to a first interface port (not expressly depicted in FIG. 1) of the signal booster 102 such that the signal booster 102 may receive the electrical uplink signal from the first antenna 108 at the first interface port. An interface port may be any suitable port configured to interface the signal booster 102 with another device (e.g., an antenna, a modem, another signal booster, etc.) through a wired connection from which the signal booster 102 may receive a signal and/or to which the signal booster 102 may communicate a signal.

In some embodiments, the signal booster 102 may be configured to apply a gain to the electrical uplink signal to amplify the electrical uplink signal. In the illustrated embodiment, the signal booster 102 may direct the amplified electrical uplink signal toward a second interface port (not expressly depicted in FIG. 1) of the signal booster 102 that may be communicatively coupled to a second antenna 110. The second antenna 110 may be configured to receive the amplified electrical uplink signal from the second interface port and may convert the amplified electrical uplink signal into an amplified wireless uplink signal 114 that may also be transmitted by the second antenna 110. The amplified wireless uplink signal 114 may then be received by the access point 104.

In some embodiments, the signal booster 102 may also be configured to filter the electrical uplink signal to remove at least some noise associated with the received wireless uplink signal 112. Consequently, the amplified wireless uplink signal 114 may have a better signal-to-noise ratio (SNR) than the wireless uplink signal 112 that may be received by the first antenna 108. Accordingly, the signal booster 102 may be configured to improve the communication of uplink signals between the access point 104 and the wireless device 106. The use of the term "uplink signal," without specifying wireless or electrical uplink signals, may refer to wireless uplink signals or electrical uplink signals. Additionally, the use of the term "uplink signal," without specifying may include uplink signals between the access point 104 and the signal booster 102 and between the signal booster 102 and the wireless device 106. Furthermore, in some embodiments, uplink signals may be referred to as first direction signals.

As another example, the access point 104 may communicate a wireless downlink signal 116 intended for the wireless device 106 and the second antenna 110 may be configured to receive the wireless downlink signal 116. The second antenna 110 may convert the received wireless downlink signal 116 into an electrical downlink signal such that the electrical downlink signal may be received at the second interface port of the signal booster 102. In some embodiments, the signal booster 102 may be configured to apply a gain to the electrical downlink signal to amplify the electrical downlink signal. The signal booster 102 may also be configured to direct the amplified electrical downlink signal toward the first interface port of the signal booster 102 such that the first antenna 108 may receive the amplified electrical downlink signal. The first antenna 108 may be configured to convert the amplified electrical downlink signal into an amplified wireless downlink signal 118 that may also be transmitted by the first antenna 108. The amplified wireless downlink signal 118 may then be received by the wireless device 106.

In some embodiments, the signal booster 102 may also be configured to filter the electrical downlink signal to remove at least some noise associated with the received wireless downlink signal 116. Therefore, the amplified wireless downlink signal 118 may have a better SNR than the wireless downlink signal 116 received by the second antenna 110. Accordingly, the signal booster 102 may also be configured to improve the communication of downlink signals, which may be second direction signals, between the access point 104 and the wireless device 106. The use of the term "downlink signal," without specifying wireless or electrical downlink signals Additionally, the use of the term "downlink signal," without specifying may include downlink signals between the access point 104 and the signal booster 102 and between the signal booster 102 and the wireless device 106. Furthermore, in some embodiments, downlink signals may be referred to as second direction signals.

Modifications may be made to the system 100 without departing from the scope of the present disclosure. For example, in some embodiments, the distance between the signal booster 102 and the wireless device 106 may be relatively close as compared to the distance between the signal booster 102 and the access point 104. Further, the system 100 may include any number of signal boosters 102, access points 104, and/or wireless devices 106. Additionally, in some embodiments, the signal booster 102 may be coupled to multiple antennas, like the first antenna 108, that are configured to communicate with wireless devices. Also, in some embodiments, the signal booster 102 may be included in a cradle configured to hold the wireless device 106. Additionally, in some embodiments, the signal booster 102 may be configured to communicate with the wireless device 106 via wired communications (e.g., using electrical signals communicated over a wire) instead of wireless communications (e.g., via wireless signals).

Additionally or alternately, although the signal booster 102 is illustrated and described with respect to performing operations with respect to wireless communications such as receiving and transmitting wireless signals via the first antenna 108 and the second antenna 110, the scope of the present disclosure is not limited to such applications. For example, in some embodiments, the signal booster 102 (or other signal boosters described herein) may be configured to perform similar operations with respect to communications that are not necessarily wireless, such as processing signals that may be received and/or transmitted via one or more modems or other signal boosters communicatively coupled to the interface ports of the signal booster 102 via a wired connection.

Additionally or alternately, the signal booster 102 may be configured to perform operations on multiple different frequency communication bands. For example, the communication spectrum for wireless communications may include multiple bands that include uplink channels and downlink channels. In these and other embodiments, the signal booster 102 may operate to boost uplink and downlink signals throughout the channels of multiple frequency bands simultaneously.

Figure 2:
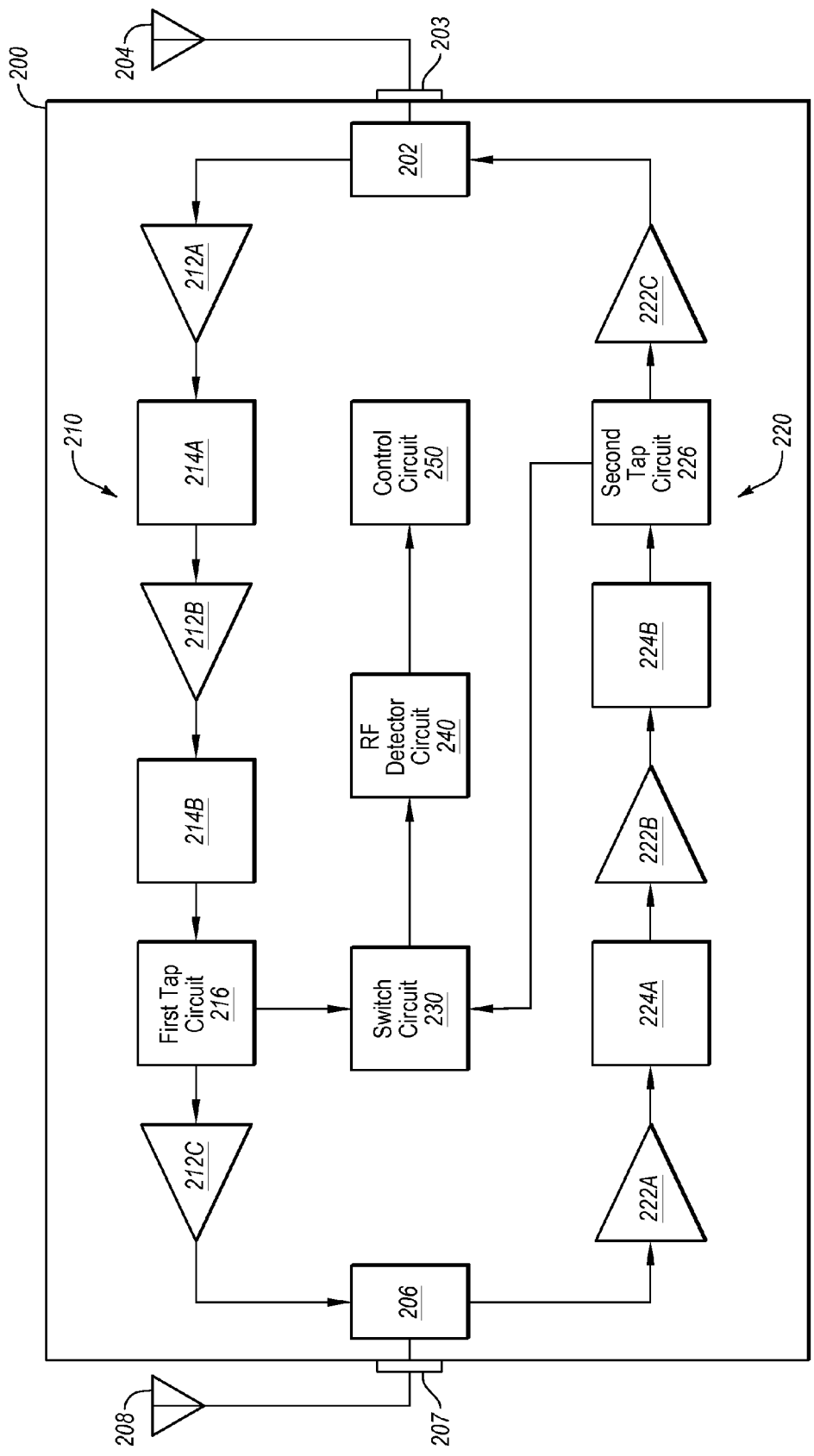
FIG. 2 illustrates an example signal booster with a multiplex detector.

FIG. 2 illustrates an example signal booster 200 with a multiplex detector, arranged in accordance with at least some embodiments described in this disclosure. In some embodiments, the signal booster 200 may be part of a wireless communication system, such as the wireless communication system 100 illustrated in FIG. 1 and may operate in a similar manner as the signal booster 102 of FIG. 1.

The signal booster 200 may include a first interface port 203 and a second interface port 207. The first interface port 203 may be coupled to a first antenna 204. The first antenna 204 may be configured to receive downlink signals from a wireless communication access point and to transmit uplink signals to the wireless communication access point. The second interface port 207 may be coupled to a second antenna 208. The second antenna 208 may be configured to receive uplink signals from a wireless device and to transmit downlink signals to the wireless device.

The signal booster 200 may also include a first duplexer 202 coupled to the first interface port 203 and a second duplexer 206 coupled to the second interface port. The signal booster 200 may further include a downlink amplification path 210 coupled between the first and second duplexers 202 and 206 and an uplink amplification path 220 coupled between the first and second duplexers 202 and 206. The signal booster 200 may further include a switch circuit 230, a radio frequency detector circuit 240 (referred to herein as the RF detector circuit 240), and a control unit 250. In some embodiments, the switch circuit 230 and the RF detector circuit 240 together may be referred to as a multiplex detector.

The downlink amplification path 210 may include a first downlink amplifier circuit 212a, a first downlink filter circuit 214a, a second downlink amplifier circuit 212b, a second downlink filter circuit 214b, a first tap circuit 216, and a third downlink amplifier circuit 212c. The first downlink amplifier circuit 212a, the second downlink amplifier circuit 212b, and third downlink amplifier circuit 212c may be referred to herein as the downlink amplifier circuits 212. Each of the downlink amplifier circuits 212 may include one or more power amplifiers, low noise amplifiers, digital or analog attenuators, among other attenuation or amplification circuits or devices. Each of the downlink amplifier circuits 212 may be configured to apply an amplification to a downlink signal passing through the signal booster 200. In these and other embodiments, the amplification may be one or greater or less than one. In some embodiments, an amplification of one or more of the downlink amplifier circuits 212 may be variable. In these and other embodiments, the gain of the one or more of the downlink amplifier circuits 212 that is variable may be controlled by the control unit 250.

The first downlink filter circuit 214a and the second downlink filter circuit 214b may each include one or more low pass, high pass, or band pass filters configured to pass frequencies to be amplified or attenuated by the signal booster 200 and filter out other frequencies.

The first downlink amplifier circuit 212a may be coupled to the output of the first duplexer 202. The first downlink filter circuit 214a may be coupled to the output of the first downlink amplifier circuit 212a. The second downlink amplifier circuit 212b may be coupled to the output of the first downlink filter circuit 214a. The second downlink filter circuit 214b may be coupled to the output of the second downlink amplifier circuit 212b. The first tap circuit 216 may be coupled to the output of the second downlink filter circuit 214b. The third downlink amplifier circuit 212c may be coupled to the first tap circuit 216.

The first tap circuit 216 may be coupled to the switch circuit 230. The first tap circuit 216 may be configured to divert a portion of a downlink signal in the downlink amplification path 210 toward the switch circuit 230. The first tap circuit 216 may be further configured to pass the remaining portion of the downlink signal to the third downlink amplifier circuit 212c for amplification. In some embodiments, the first tap circuit 216 may include a resistor, a splitter, a capacitor, a directional coupler, or some other circuit or circuit component.

The uplink amplification path 220 may include a first uplink amplifier circuit 222a, a first uplink filter circuit 224a, a second uplink amplifier circuit 222b, a second uplink filter circuit 224b, a second tap circuit 226, and a third uplink amplifier circuit 222c.

The first uplink amplifier circuit 222a, the second uplink amplifier circuit 222b, and third uplink amplifier circuit 222c may be referred to herein as the uplink amplifier circuits 222. Each of the uplink amplifier circuits 222 may include one or more power amplifiers, low noise amplifiers, digital or analog attenuators, among other attenuation or amplification circuits or devices. Each of the uplink amplifier circuits 222 may be configured to apply an amplification to an uplink signal passing through the signal booster 200. In these and other embodiments, the amplification may be one or greater or less than one. In some embodiments, an amplification of one or more of the uplink amplifier circuits 222 may be variable. In these and other embodiments, the gain of the one or more of the uplink amplifier circuits 222 that is variable may be controlled by the control unit 250.

The first uplink filter circuit 224a and the second uplink filter circuit 224b may each include one or more low pass, high pass, or band pass filters configured to pass frequencies to be amplified or attenuated by the signal booster 200 and filter out other frequencies.

The first uplink amplifier circuit 222a may be coupled to the output of the first duplexer 202. The first uplink filter circuit 224a may be coupled to the output of the first uplink amplifier circuit 222a. The second uplink amplifier circuit 222b may be coupled to the output of the first uplink filter circuit 224a. The second uplink filter circuit 224b may be coupled to the output of the second uplink amplifier circuit 222b. The second tap circuit 226 may be coupled to the output of the second uplink filter circuit 224b. The third uplink amplifier circuit 222c may be coupled to the second tap circuit 226.

The second tap circuit 226 may be coupled to the switch circuit 230. The second tap circuit 226 may be configured to divert a portion of an uplink signal in the uplink amplification path 220 toward the switch circuit 230. The second tap circuit 226 may be further configured to pass the remaining portion of the uplink signal to the third uplink amplifier circuit 222c for amplification. In some embodiments, the second tap circuit 226 may include a resistor, a splitter, a capacitor, a directional coupler, or some other circuit or circuit component. In some embodiments, the first and second tap circuits 216 and 226 may include the same components or different components.

The switch circuit 230 may be coupled to the first tap circuit 216, the second tap circuit 226, and the RF detector circuit 240. The switch circuit 230 may be configured to switch between electrically coupling the RF detector circuit 240 to the first tap circuit 216 and electrically coupling the RF detector circuit 240 to the second tap circuit 226 to provide either a portion of the downlink signal or a portion of the uplink signal to the RF detector circuit 240. In some embodiments, the switch circuit 230 may electrically couple the first and second tap circuits 216 and 226 to the RF detector circuit 240 for equal alternating periods. Alternately or additionally, the switch circuit 230 may couple the first and second tap circuits 216 and 226 to the RF detector circuit 240 for unequal alternating periods, random periods, or following some other sequence.

In some embodiments, the switch circuit 230 may continue to receive a portion of the uplink and downlink signals from the first and second tap circuits 216 and 226 even when the first and second tap circuits 216 and 226 are not electrically coupled to the RF detector circuit 240. For example, when the first tap circuit 216 is electrically coupled to the RF detector circuit 240 and providing a portion of a downlink signal to the RF detector circuit 240, the second tap circuit 226 may also be providing a portion of an uplink signal to the switch circuit 230. In these and other embodiments, the switch circuit 230 may isolate the portion of the uplink signal from the RF detector circuit 240 and from the downlink amplification path 210. In some embodiments, the switch circuit 230 may ground the uplink or downlink signal not being passed to the RF detector circuit 240. In some embodiments, the switch circuit 230 may include a tri-state. In the tri-state, the switch circuit 230 may not electrically couple either one of the first and second tap circuits 216 and 226 to the RF detector circuit 240.

In some embodiments, the switch circuit 230 may be controlled by the control unit 250. In these and other embodiments, the switch circuit 230 may couple the RF detector circuit 240 to one of the first and second tap circuits 216 and 226 based on a command from the control unit 250.

The RF detector circuit 240 may be coupled to the control unit 250 and the switch circuit 230 and configured to receive a portion of a downlink signal from the first tap circuit 216 and a portion of an uplink signal from the second tap circuit 226. In some embodiments, the RF detector circuit 240 may not receive the portion of the downlink signal from the first tap circuit 216 and the portion of the uplink signal from the second tap circuit 226 at the same time but at different times. In these and other embodiments, the RF detector circuit 240 may be configured to detect a power level of the portions of the downlink and uplink signals. The RF detector circuit 240 may provide the detected power levels to the control unit 250. In some embodiments, the RF detector circuit 240 may include a diode, a log detector, or some other radio frequency detection circuit components.

The control unit 250 may be configured to receive the detected power levels of the downlink and uplink signals in the signal booster 200. Based on the detected power levels of the downlink signals, the control unit 250 may adjust an amplification applied to the downlink signal in the downlink amplification path 210. For example, the control unit 250 may be configured to adjust the amplification in one or more of the downlink amplification circuits 212.

Based on the detected power levels of the uplink signals, the control unit 250 may adjust an amplification applied to the uplink signal in the uplink amplification path 220. For example, the control unit 250 may be configured to adjust the amplification in one or more of the uplink amplifier circuits 222. Thus, the control unit 250 may adjust the amplification in the uplink and downlink amplification paths 210 and 220 independently using information from the single RF detector circuit 240.

In some embodiments, the control unit 250 may adjust the amplification in the uplink and downlink amplification paths 210 and 220 as part of a feedback control loop that uses the single RF detector circuit 240. For example, the control unit 250 may adjust the amplification in the first uplink amplifier circuit 222a, receive an indication of the power level of the uplink signal from the RF detector circuit 240 by way of the second tap circuit 226 and the switch circuit 230. Based on the indication of the power level after adjusting the amplification, the control unit 250 may further adjust the amplification applied to the uplink signal.

In general, the control unit 250 may adjust the amplification in the uplink and downlink amplification paths 210 and 220 based on configurations of the wireless communication network in which the signal booster 200 is operating. For example, the signal booster 200 may operate to increase or decrease an amplification applied to the uplink and downlink signals based on noise levels at an access point, government regulations, and wireless communication operator regulations, among others. In short, the signal booster 200 may apply any known algorithm or scheme to apply amplification to downlink and uplink signals to enhance or otherwise make communications between the wireless device and the access point function within the constraints of the wireless communications network in which the signal booster 200 is operating. For example, U.S. Pat. No. 8,583,034 describes adjusting amplifications in uplink and downlink amplification paths in a signal booster in a wireless network to provide noise floor, internal oscillation, external oscillation (e.g., port-to-port oscillations), and/or overload protection for a wireless network. The U.S. Pat. No. 8,583,034 is incorporated herein by reference in its entirety.

A description of the operation of the signal booster 200 with respect to uplink and downlink signals follows. Downlink signals may be received by the first antenna 204 from an access point and provided to the downlink amplification path 210. The downlink amplification path 210 may apply filtering and an amplification to the downlink signals based on the characteristics of the wireless communication network in which the signal booster 200 is operating. The first tap circuit 216 may provide a portion of the downlink signals to the switch circuit 230. The switch circuit 230 may be electrically coupling the first tap circuit 216 with the RF detector circuit 240. Thus, the portion of the downlink signals may be provided to the RF detector circuit 240. The RF detector circuit 240 may provide a power level of the downlink signals to the control unit 250. The control unit 250 may adjust the amplification applied by the downlink amplification path 210 accordingly.

Uplink signals may be received by the second antenna 208 from a wireless device and provided to the uplink amplification path 220. The uplink amplification path 220 may apply filtering and an amplification to the uplink signals based on the characteristics of the wireless communication network in which the signal booster 200 is operating. The second tap circuit 226 may provide a portion of the uplink signals to the switch circuit 230. The switch circuit 230 may be electrically coupling the first tap circuit 216 with the RF detector circuit 240. Thus, the portion of the uplink signals may not be provided to the RF detector circuit 240. After some period, the switch circuit 230 may disconnect the first tap circuit 216 and the RF detector circuit 240 and electrically couple the second tap circuit 226 with the RF detector circuit 240, such that the portion of the uplink signals may be provided to the RF detector circuit 240. The RF detector circuit 240 may provide a power level of the uplink signals to the control unit 250. The control unit 250 may adjust the amplification applied by the uplink amplification path 220 accordingly.

The switch circuit 230 may switch between electrically coupling the first tap circuit 216 with the RF detector circuit 240 and electrically coupling the second tap circuit 226 with the RF detector circuit 240, periodically. In some embodiments, the switch circuit 230 may switch periodically at regular or irregular intervals. For example, in some embodiments the switch circuit 230 may switch between electrically coupling the first tap circuit 216 with the RF detector circuit 240 and electrically coupling the second tap circuit 226 with the RF detector circuit 240 every 0.1, 1, 10, 20, 50, 100, or 500 milliseconds or at some other interval.

Modifications, additions, or omissions may be made to the signal booster 200 without departing from the scope of the present disclosure. For example, in some embodiments, the signal booster 200 may include additional interface ports that are coupled to antennas that are configured to communicate with wireless devices. Alternately or additionally, in some embodiments, the signal booster 200 may include multiple downlink and uplink amplification paths that are each configured to carry signals of different frequency bands of a wireless communication network.

In some embodiments, the downlink and uplink amplifications paths 210 and 220 may include a different number or order of the amplification and filtering circuits than illustrated and described. Alternately or additionally, the first and second tap circuits 216 and 226 may be positioned in different locations within the downlink and uplink amplifications paths 210 and 220, respectively.

Figure 3:
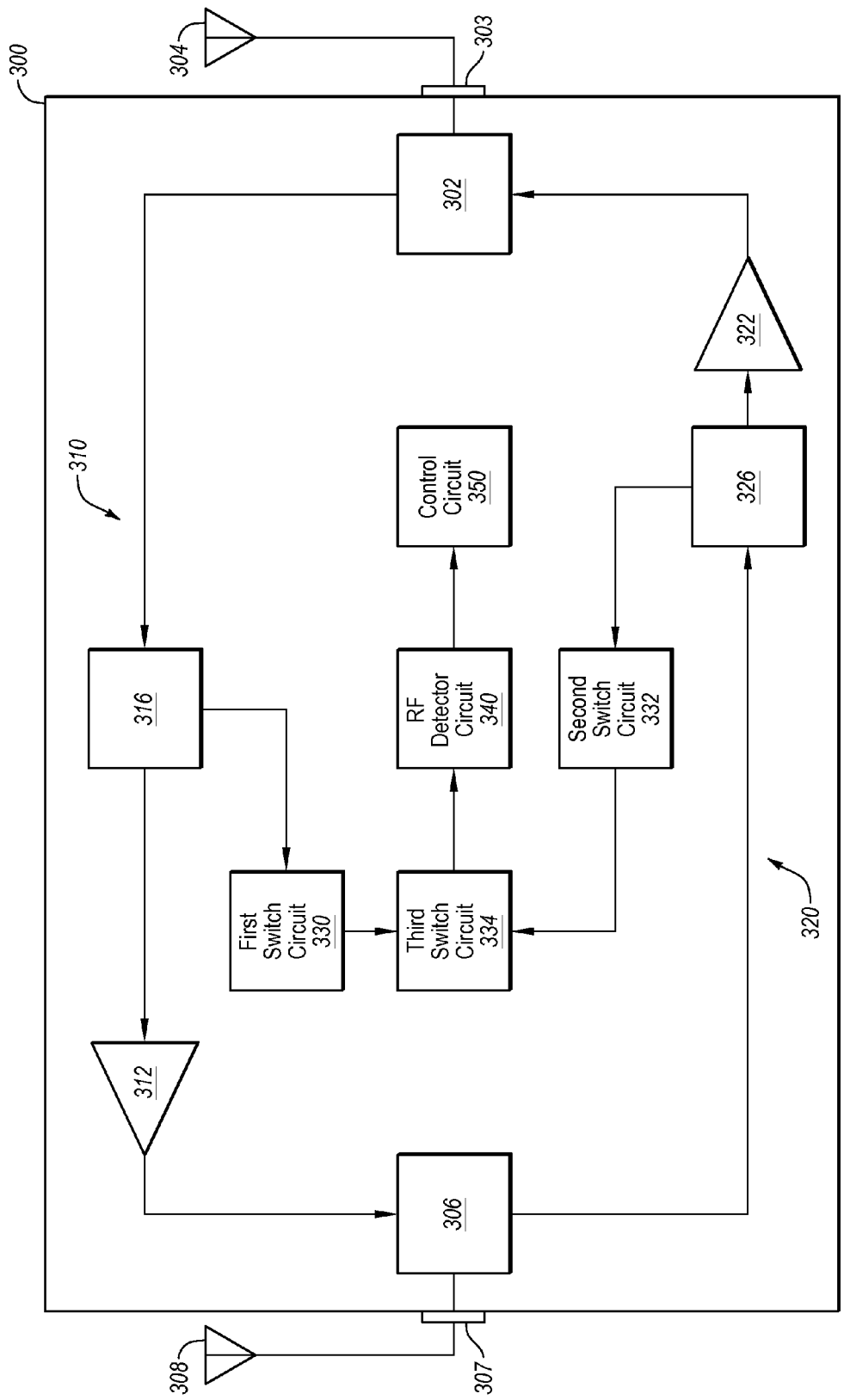
FIG. 3 illustrates another example signal booster with a multiplex detector.

FIG. 3 illustrates another example signal booster 300 with a multiplex detector, arranged in accordance with at least some embodiments described in this disclosure. In some embodiments, the signal booster 300 may be part of a wireless communication system, such as the wireless communication system 100 illustrated in FIG. 1 and may operate in a similar manner as the signal booster 102 of FIG. 1.

The signal booster 300 may include a first interface port 303 and a second interface port 307. The first interface port 303 may be coupled to a first antenna 304. The first antenna 304 may be configured to receive downlink signals from a wireless communication access point and to transmit uplink signals to the wireless communication access point. The second interface port 307 may be coupled to a second antenna 308. The second antenna 308 may be configured to receive uplink signals from a wireless device and to transmit downlink signal to the wireless device.

The signal booster 300 may also include a first duplexer 302 coupled to the first interface port 303 and a second duplexer 306 coupled to the second interface port. The signal booster 300 may further include a downlink amplification path 310 coupled between the first and second duplexers 302 and 306 and an uplink amplification path 320 coupled between the first and second duplexers 302 and 306. The signal booster 300 may further include a first switch circuit 330, a second switch circuit 332, a third switch circuit 334, a radio frequency detector circuit 340 (referred to herein as the RF detector circuit 340), and a control unit 350.

The downlink amplification path 310 may include a downlink amplifier circuit 312 and a first tap circuit 316. The downlink amplifier circuit 312 and the first tap circuit 316 may operate in a similar manner as the downlink amplifier circuits 212 and the first tap circuit 216 of FIG. 2. In some embodiments, the downlink amplification path 310 may include multiple downlink amplifier circuits and filter circuits similar to the downlink amplification path 210 of FIG. 2.

The uplink amplification path 320 may include an uplink amplifier circuit 322 and a second tap circuit 326. The uplink amplifier circuit 322 and the second tap circuit 326 may operate in a similar manner the uplink amplifier circuits 222 and the second tap circuit 226 of FIG. 2. In some embodiments, the uplink amplification path 320 may include multiple downlink amplifier circuits and filter circuits similar to the uplink amplification path 220 of FIG. 2.

The first switch circuit 330 may be coupled between the first tap circuit 316 and the third switch circuit 334. The first switch circuit 330 may be configured to electrically couple and decouple the first tap circuit 316 from the third switch circuit 334. When the first switch circuit 330 is electrically coupling the first tap circuit 316 and the third switch circuit 334, the first switch circuit 330 may be referred to as closed. When the first switch circuit 330 is not electrically coupling the first tap circuit 316 and the third switch circuit 334, the first switch circuit 330 may be referred to as open.

The first switch circuit 330 may be configured to pass a portion of a downlink signal from the first tap circuit 316 to the third switch circuit 334 when the first switch circuit 330 is electrically coupling the first tap circuit 316 to the third switch circuit 334. Likewise, the first switch circuit 330 may be configured to not pass a portion of a downlink signal from the first tap circuit 316 to the third switch circuit 334 when the first switch circuit 330 is not electrically coupling the first tap circuit 316 to the third switch circuit 334. The first switch circuit 330 may continue to receive the portion of the downlink signal from the first tap circuit 316 even when the first tap circuit 316 is decoupled from the third switch circuit 334. In these and other embodiments, the first switch circuit 330 may ground the portion of the downlink signal.

In some embodiments, the first switch circuit 330 may be controlled by the control unit 350. In these and other embodiments, the first switch circuit 330 may electrically couple and decouple the first tap circuit 316 from the third switch circuit 334 based on communications from the control unit 350.

The second switch circuit 332 may be coupled between the second tap circuit 326 and the third switch circuit 334. The second switch circuit 332 may be configured to electrically couple and decouple the second tap circuit 326 from the third switch circuit 334. When the second switch circuit 332 is electrically coupling the second tap circuit 326 and the third switch circuit 334, the second switch circuit 332 may be referred to as closed. When the second switch circuit 332 is not electrically coupling the second tap circuit 326 and the third switch circuit 334, the second switch circuit 332 may be referred to as open.

The second switch circuit 332 may be configured to pass a portion of an uplink signal from the second tap circuit 326 to the third switch circuit 334 when the second switch circuit 332 is electrically coupling the second tap circuit 326 to the third switch circuit 334. Likewise, the second switch circuit 332 may be configured to not pass a portion of an uplink signal from the second tap circuit 326 to the third switch circuit 334 when the second switch circuit 332 is not electrically coupling the second tap circuit 326 to the third switch circuit 334. The second switch circuit 332 may continue to receive the portion of the uplink signal from the second tap circuit 326 even when the second tap circuit 326 is decoupled from the third switch circuit 334. In these and other embodiments, the second switch circuit 332 may ground the portion of the uplink signal.

In some embodiments, the second switch circuit 332 may be controlled by the control unit 350. In these and other embodiments, the second switch circuit 332 may electrically couple and decouple the second tap circuit 326 from the third switch circuit 334 based on communications from the control unit 350.

The third switch circuit 334 may be coupled to the first switch circuit 330, the second switch circuit 332, and the RF detector circuit 340. The third switch circuit 334 may be configured to switch between coupling the RF detector circuit 340 to the first switch circuit 330 and electrically coupling the RF detector circuit 340 to the second switch circuit 332. When the first switch circuit 330 is providing the portion of the downlink signal to the third switch circuit 334, the third switch circuit 334 may electrically couple the first switch circuit 330 and the RF detector circuit 340 to provide the portion of the downlink signal to the RF detector circuit 340. When the second switch circuit 332 is providing the portion of the uplink signal to the third switch circuit 334, the third switch circuit 334 may electrically couple the second switch circuit 332 and the RF detector circuit 340 to provide the portion of the uplink signal to the RF detector circuit 340.

The RF detector circuit 340 may be coupled to the control unit 350 and the third switch circuit 334 and configured to receive a portion of a downlink signal from the first tap circuit 316 and a portion of an uplink signal from the second tap circuit 326. In these and other embodiments, the RF detector circuit 340 may be configured to detect a power level of the portions of the downlink and uplink signals. The RF detector circuit 340 may provide the detected power levels to the control unit 350. In some embodiments, the RF detector circuit 340 may include a diode, a log detector, or some other radio frequency detection circuit components.

The control unit 350 may be configured to receive the detected power levels of the downlink and uplink signals in the signal booster 300. Based on the detected power levels of the downlink signals, the control unit 350 may adjust an amplification gain applied to the downlink signal in the downlink amplification path 310. Based on the detected power levels of the uplink signals, the control unit 350 may adjust an amplification applied to the uplink signal in the uplink amplification path 320. In some embodiments, the control unit 350 may adjust an amplification applied to the uplink and downlink signals in analogous manner as the control unit 250 adjusts amplification in the signal booster 200 in FIG. 2.

In some embodiments, the control unit 350 may be implemented by any suitable mechanism, such as a program, software, function, library, software as a service, analog, or digital circuitry, or any combination thereof. For example, the control unit 350 may include a processor and memory. The processor may include, for example, a microprocessor, microcontroller, digital signal processor (DSP), application-specific integrated circuit (ASIC), a Field-Programmable Gate Array (FPGA), or any other digital or analog circuitry configured to interpret and/or to execute program instructions and/or to process data. In some embodiments, the processor may interpret and/or execute program instructions and/or process data stored in the memory.

The memory may include any suitable computer-readable media configured to retain program instructions and/or data for a period of time. By way of example, and not limitation, such computer-readable media may include tangible and/or non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general-purpose or special-purpose computer. Combinations of the above may also be included within the scope of computer-readable media. Computer-executable instructions may include, for example, instructions and data that cause a general-purpose computer, special-purpose computer, or special-purpose processing device to perform a certain function or group of functions.

In some embodiments, the control unit 350 may be configured to control the first switch circuit 330 such that the first switch circuit 330 is only closed when the third switch circuit 334 is electrically coupling the first switch circuit 330 and the RF detector circuit 340. In these and other embodiments, the first switch circuit 330 may be open until after the third switch circuit 334 electrically couples the first switch circuit 330 and the RF detector circuit 340. The first switch circuit 330 may also open before the third switch circuit 334 electrically decouples the first switch circuit 330 and the RF detector circuit 340. In some embodiments, in an analogous manner, the control unit 350 may be configured to control the second switch circuit 332 such that the second switch circuit 332 is only closed when the third switch circuit 334 is electrically coupling the second switch circuit 332 and the RF detector circuit 340.

The first and second switch circuits 330 and 332 configured as described may increase isolation between the uplink and downlink amplifications paths 320 and 310. Increasing the isolation may reduce internal oscillations in the signal booster 300.

An example of the operation of the signal booster 300 follows. The first and second switch circuits 330 and 332 may be open. The third switch circuit 334 may electrically couple the first switch circuit 330 and the RF detector circuit 340. The first switch circuit 330 may close such that a portion of a downlink signal may be provided to the RF detector circuit 340. The first switch circuit 330 may open. The third switch circuit 334 may electrically decouple the first switch circuit 330 and the RF detector circuit 340 and electrically couple the second switch circuit 332 and the RF detector circuit 340. The second switch circuit 332 may close such that a portion of an uplink signal may be provided to the RF detector circuit 340. The second switch circuit 332 may open before the third switch circuit 334 may electrically decouple the second switch circuit 332 and the RF detector circuit 340.

Modifications, additions, or omissions may be made to the signal booster 300 without departing from the scope of the present disclosure. For example, in some embodiments, the signal booster 300 may include additional interface ports that are coupled to antennas that are configured to communicate with wireless devices. Alternately or additionally, in some embodiments, the signal booster 300 may include multiple downlink and uplink amplification paths that are each configured to carry signals of different frequency bands.

In some embodiments, the downlink and uplink amplifications paths 310 and 320 may include a different number or order of amplification and filtering circuits. Alternately or additionally, the first and second tap circuits 316 and 326 may be positioned in different locations within the downlink and uplink amplifications paths 310 and 320, respectively. Alternately or additionally, the signal booster 300 may not include either the first switch circuit 330 or the second switch circuit 332 or may include additional switch circuits.

Figure 4A:
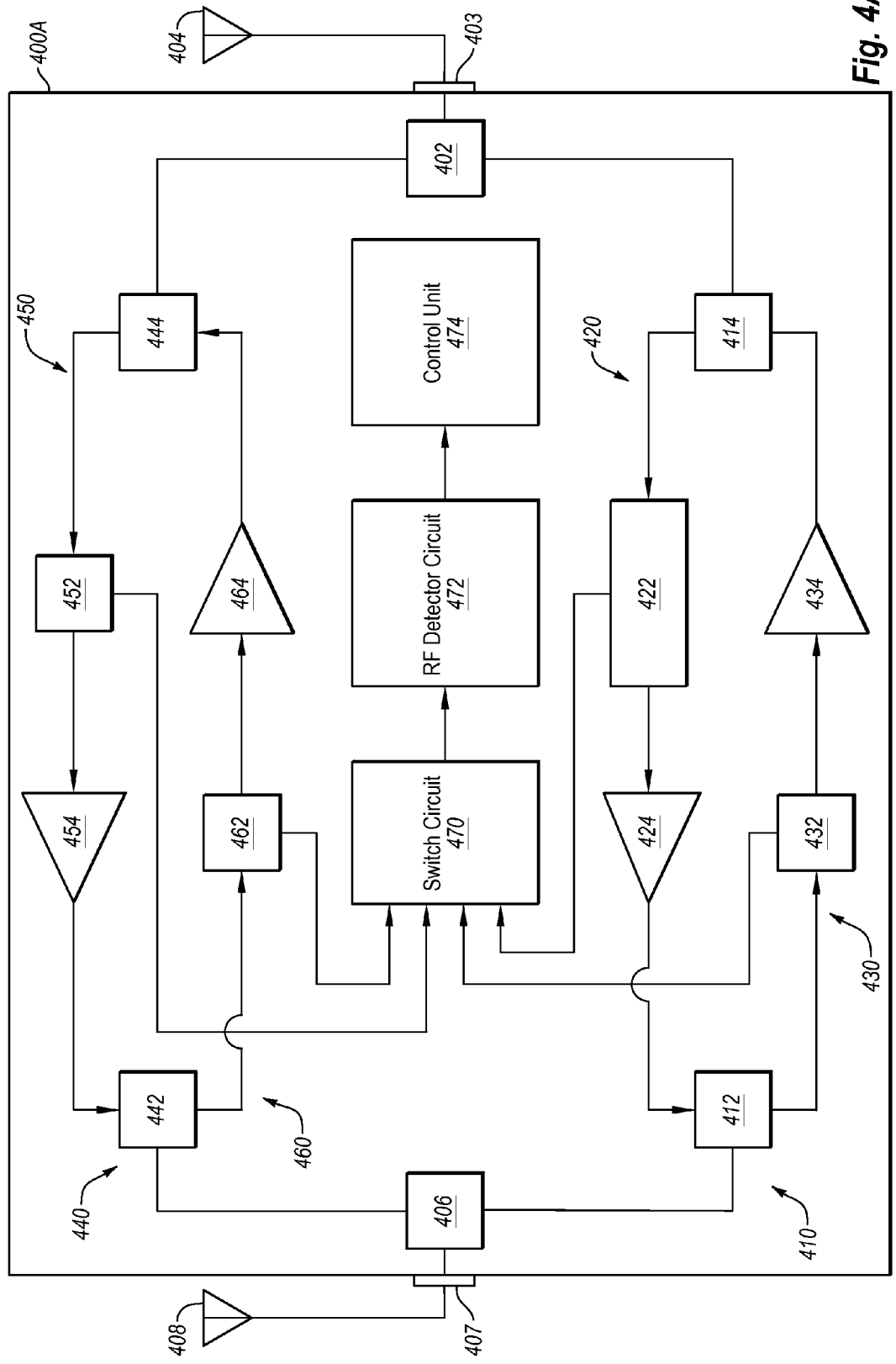
FIG. 4A illustrates another example signal booster with a multiplex detector.

FIG. 4A illustrates another example signal booster 400A with a multiplex detector, arranged in accordance with at least some embodiments described in this disclosure. In some embodiments, the signal booster 400A may be part of a wireless communication system, such as the wireless communication system 100 illustrated in FIG. 1.

The signal booster 400A may include a first interface port 403 and a second interface port 407. The first interface port 403 may be coupled to a first antenna 404. The first antenna 404 may be configured to receive downlink signals from a wireless communication access point and to transmit uplink signals to the wireless communication access point. The second interface port 407 may be coupled to a second antenna 408. The second antenna 408 may be configured to receive uplink signals from a wireless device and to transmit downlink signal to the wireless device.

The signal booster 400 may also include a first duplexer 402 coupled to the first interface port 403 and a second duplexer 406 coupled to the second interface port 407. The signal booster 400 may further include a first-band booster 410 and a second-band booster 440 coupled between the first and second duplexers 402 and 406.

The first-band booster 410 may include a first first-band duplexer 412 and a second first-band duplexer 414. The first-band booster 410 may further include a first-band downlink amplification path 420 and a first-band uplink amplification path 430, which each may be coupled between the first first-band duplexer 412 and the second first-band duplexer 414.

The first-band downlink amplification path 420 may include a first tap circuit 422 and a first amplification circuit 424. The first-band uplink amplification path 430 may include a second tap circuit 432 and a second amplification circuit 434. Each of the first and second tap circuits 422 and 432 may be coupled to the switch circuit 470. The first tap circuit 422 may be configured to provide a portion of the first-band downlink signal to the switch circuit 470. The second tap circuit 432 may be configured to provide a portion of the first-band uplink signal to the switch circuit 470.

The second-band booster 440 may include a first second-band duplexer 442 and a second second-band duplexer 444. The second-band booster 440 may further include a second-band downlink amplification path 450 and a second-band uplink amplification path 460, which both may be coupled between the first second-band duplexer 442 and the second second-band duplexer 444.

The second-band downlink amplification path 450 may include a third tap circuit 452 and a third amplification circuit 454. The second-band uplink amplification path 460 may include a fourth tap circuit 462 and a fourth amplification circuit 464. Each of the third and fourth tap circuits 452 and 462 may be coupled to the switch circuit 470. The third tap circuit 452 may be configured to provide a portion of the second-band downlink signal to the switch circuit 470.

The fourth tap circuit 462 may be configured to provide a portion of the second-band uplink signal to the switch circuit 470.

The switch circuit 470 may be coupled to the first tap circuit 422, the second tap circuit 432, the third tap circuit 452, the fourth tap circuit 462, and the RF detector circuit 472. The switch circuit 470 may be configured to switch between electrically coupling the first tap circuit 422, the second tap circuit 432, the third tap circuit 452, and the fourth tap circuit 462 to the RF detector circuit 472. As a result, the switch circuit 470 may be configured to provide a portion of a first-band downlink signal, a first-band uplink signal, a second-band downlink signal, and a second-band uplink signal, one at a time, to the RF detector circuit 472.

In some embodiments, the switch circuit 470 may electrically couple the first tap circuit 422, the second tap circuit 432, the third tap circuit 452, and the fourth tap circuit 462 to the RF detector circuit 472 for equal alternating periods. Alternately or additionally, the switch circuit 470 may couple the first tap circuit 422, the second tap circuit 432, the third tap circuit 452, and the fourth tap circuit 462 to the RF detector circuit 472 for unequal alternating periods, random periods, or following some other sequence.

In some embodiments, the switch circuit 472 may continue to receive a portion of the first-band and second-band uplink and downlink signals from the first tap circuit 422, the second tap circuit 432, the third tap circuit 452, and the fourth tap circuit 462 even when the first tap circuit 422, the second tap circuit 432, the third tap circuit 452, and the fourth tap circuit 462 are not electrically coupled to the RF detector circuit 472.

In some embodiments, the switch circuit 470 may be controlled by the control unit 474. In these and other embodiments, the switch circuit 470 may couple the RF detector circuit 472 to one of the first tap circuit 422, the second tap circuit 432, the third tap circuit 452, and the fourth tap circuit 462 based on a command from the control unit 474.

The RF detector circuit 472 may be coupled to the control unit 474 and the switch circuit 470 and configured to receive a portion of downlink and uplink signals of the first and second bands at different times. In these and other embodiments, the RF detector circuit 472 may be configured to detect a power level of the portions of the downlink and uplink signals of the first and second bands. The RF detector circuit 472 may provide the detected power levels to the control unit 474. In some embodiments, the RF detector circuit 472 may include a diode, a log detector, or some other radio frequency detection circuit components.

The control unit 474 may be configured to receive the detected power levels of the downlink and uplink signals of the first and second bands in the signal booster 400A. Based on the detected power levels of the downlink signals, the control unit 474 may adjust an amplification applied to the downlink and uplink signals of the first and second bands by the signal booster 400A.

Modifications, additions, or omissions may be made to the signal booster 400A without departing from the scope of the present disclosure. For example, in some embodiments, the signal booster 400A may include additional interface ports that are coupled to antennas that are configured to communicate with wireless devices. Alternately or additionally, in some embodiments, the signal booster 200 may include multiple other band boosters.

In some embodiments, the downlink and uplink amplifications paths 420, 430, 450, and 460 may include a different number or order of the amplification circuits than disclosed and illustrated. Alternately or additionally, the first-band booster 410 and the second-band booster 440 may include filter circuits. Alternately or additionally, the first tap circuit 422, the second tap circuit 432, the third tap circuit 452, and the fourth tap circuit 462 may be positioned in different locations within the first-band booster 410 and the second-band booster 440. Alternately or additionally, the signal booster 400A may include additional switches configured in a manner analogous to the first and second switch circuits 330 and 332 of FIG. 3.

Figure 4B:
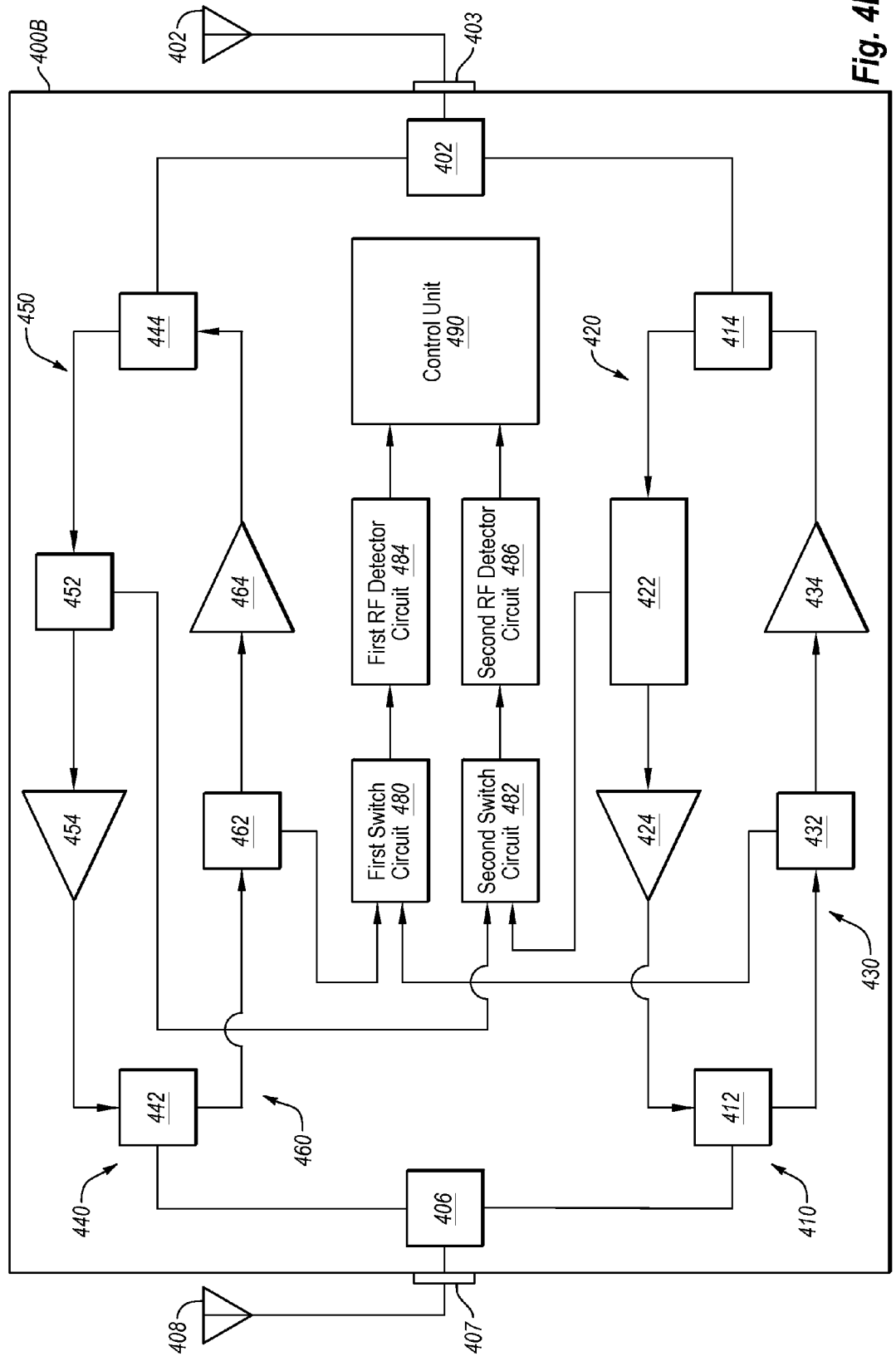
FIG. 4B illustrates another example signal booster with a multiplex detector.

FIG. 4B illustrates another example signal booster 400B with a multiplex detector, arranged in accordance with at least some embodiments described in this disclosure. In some embodiments, the signal booster 400B may be part of a wireless communication system, such as the wireless communication system 100 illustrated in FIG. 1. The signal booster 400B may be analogous to the signal booster 400A, expect that the signal booster 400B may include first and second switch circuits 480 and 482 in place of the switch circuit 470 of signal booster 400A and may include first and second RF detector circuits 484 and 486 in place of the RF detector circuit 472 of signal booster 400A.

As illustrated in FIG. 4B, the first switch circuit 480 may be coupled to the second tap circuit 432, the fourth tap circuit 462, and the first RF detector circuit 484. The first switch circuit 480 may be configured to switch between electrically coupling the second tap circuit 432 and the fourth tap circuit 462 to the first RF detector circuit 484. As a result, the first switch circuit 480 may provide a portion of the first-band uplink signal and the second-band uplink signal, one at a time, to the first RF detector circuit 484.

In some embodiments, the first switch circuit 480 may electrically couple the second tap circuit 432 and the fourth tap circuit 462 to the first RF detector circuit 484 for equal alternating periods. Alternately or additionally, the first switch circuit 480 may electrically couple the second tap circuit 432 and the fourth tap circuit 462 to the first RF detector circuit 484 for unequal alternating periods, random periods, or following some other sequence.

The first RF detector circuit 484 may be coupled to the control unit 490 and the first switch circuit 480 and may be configured to receive a portion of uplink signals of the first and second bands at different times. In these and other embodiments, the first RF detector circuit 484 may be configured to detect a power level of the portions of the uplink signals of the first and second bands. The first RF detector circuit 484 may provide the detected power levels to the control unit 490. In some embodiments, the first RF detector circuit 484 may include a diode, a log detector, or some other radio frequency detection circuit components.

The control unit 490 may be configured to receive the detected power levels of the uplink signals of the first and second bands in the signal booster 400B. Based on the detected power levels of the uplink signal of the first band, the control unit 490 may adjust an amplification applied to the uplink signals of the first band. Based on the detected power levels of the uplink signal of the second band, the control unit 490 may adjust an amplification applied to the uplink signals of the second band.

In some embodiments, the second switch circuit 482 may electrically couple the first tap circuit 422 and the third tap circuit 452 to the second RF detector circuit 486 for equal alternating periods. Alternately or additionally, the second switch circuit 482 may electrically couple the first tap circuit 422 and the third tap circuit 452 to the second RF detector circuit 486 for unequal alternating periods, random periods, or following some other sequence. In some embodiments, the first and second switch circuits 480 and 482 may switch at a similar or different rates, sequences, or periods.

The second RF detector circuit 486 may be coupled to the control unit 490 and the second switch circuit 482 and may be configured to receive a portion of downlink signals of the first and second bands at different times. In these and other embodiments, the second RF detector circuit 486 may be configured to detect a power level of the portions of the downlink signals of the first and second bands. The second RF detector circuit 486 may provide the detected power levels to the control unit 490. In some embodiments, the second RF detector circuit 486 may include a diode, a log detector, or some other radio frequency detection circuit components.

The control unit 490 may be configured to receive the detected power levels of the downlink signals of the first and second bands in the signal booster 400B. Based on the detected power levels of the downlink signal of the first band, the control unit 490 may adjust an amplification applied to the downlink signals of the first band. Based on the detected power levels of the downlink signal of the second band, the control unit 490 may adjust an amplification applied to the downlink signals of the second band.

The first switch circuit 480 handling switching between the uplink signals and the second switch circuit 482 handling switching between the downlink signals may provide further isolation between the uplink and downlink amplification paths of the first-band booster 410 and the second-band booster 440 as compared to the single switch circuit 470 in the signal booster 400A in FIG. 4A.

Modifications, additions, or omissions may be made to the signal booster 400B without departing from the scope of the present disclosure. For example, in some embodiments, the signal booster 400B may multiple other band boosters. In these and other embodiments, the downlink paths of the other band boosters may be coupled to the second switch circuit 482 and the uplink paths of the other band boosters may be coupled to the first switch circuit 480. Alternately or additionally, the signal booster 400B may include additional switches configured in a manner analogous to the first and second switch circuits 330 and 332 of FIG. 3.

Figure 5:
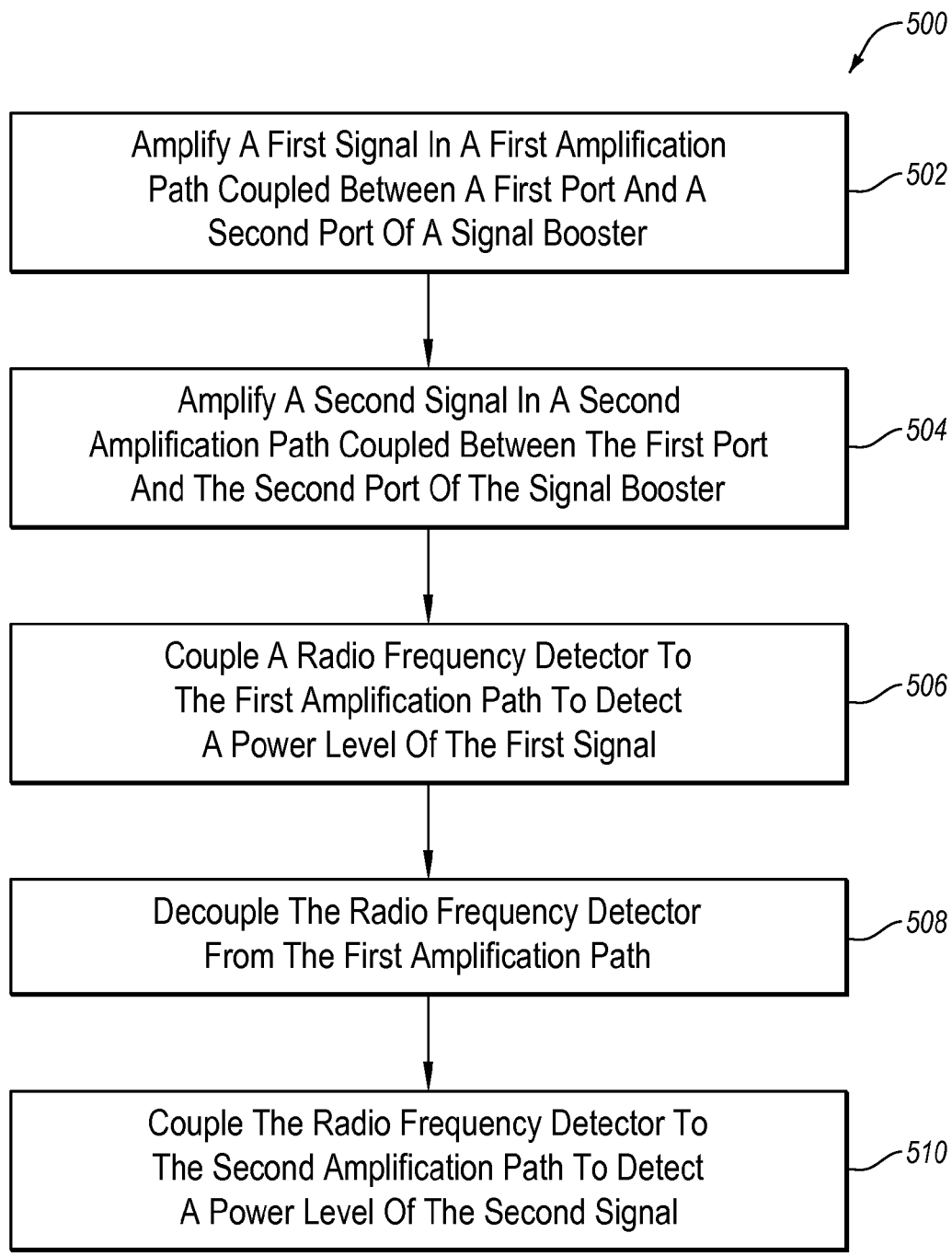
FIG. 5 is a flowchart of an example method of detecting signals in a signal booster.

FIG. 5 is a flowchart of an example method 500 of detecting signals in a signal booster, arranged in accordance with at least some embodiments described herein. The method 500 may be implemented, in some embodiments, by a signal booster, such as the signal booster 102, 200, 300, 400A or 400B of FIGS. 1, 2, 3, 4A, and 4B, respectively. Although illustrated as discrete blocks, various blocks may be divided into additional blocks, combined into fewer blocks, or eliminated, depending on the desired implementation.

The method 500 may begin at block 502, where a first signal in a first amplification path coupled between a first port and a second port of a signal booster may be amplified. In block 504, a second signal in a second amplification path coupled between the first port and the second port of the signal booster may be amplified.

In some embodiments, the first signal may be a first-direction signal and the first amplification path may be a first-direction amplification path. Alternately or additionally, the second signal may be a second-direction signal and the second amplification path may be a second-direction amplification path. In these and other embodiments, a first-direction signal may be an uplink signal and a second-direction signal may be a downlink signal. Alternately or additionally, a first-direction signal may be a downlink signal and a second-direction signal may be an uplink signal.

In some embodiments, the first signal may be a first first-direction signal and the first amplification path may be a first first-direction amplification path. Alternately or additionally, the second signal may be a second first-direction signal and the second amplification path may be a second first-direction amplification path.

In block 506, a radio frequency detector may be coupled to the first amplification path to detect a power level of the first signal. In block 508, the radio frequency detector may be decoupled from the first amplification path.

In block 510, the radio frequency detector may be coupled to the second amplification path to detect a power level of the second signal. In some embodiments, decoupling the radio frequency detector from the first amplification path and coupling the radio frequency detector to the second amplification path may occur while the first signal is amplified by the first amplification path.

One skilled in the art will appreciate that, for this and other processes and methods disclosed in this disclosure, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 500 may further include controlling the amplification of the first signal in the first amplification path based on the power level of the first signal. In these and other embodiments, the method 500 may further include controlling the amplification of the second signal in the second amplification path based on the power level of the second signal.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description of embodiments, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that various changes, substitutions, and alterations could be made hereto without departing from the spirit and scope of the present disclosure.

What is claimed is:

1. A signal booster, comprising:
   a first port;
   a second port;
   a first uplink amplification path that includes a first uplink tap circuit, the first uplink amplification path coupled between the first port and the second port and configured to pass a first uplink signal of a first frequency in a wireless communication network;
   a second uplink amplification path that includes a second uplink tap circuit, the second uplink amplification path coupled between the first port and the second port and configured to pass a second uplink signal of a second frequency in the wireless communication network;
   an uplink radio frequency detector circuit;
   an uplink switch circuit coupled to the first uplink tap circuit, to the second uplink tap circuit, and the uplink radio frequency detector circuit, the uplink switch circuit configured to switch between coupling the uplink radio frequency detector circuit to the first uplink tap circuit and coupling the uplink radio frequency detector circuit to the second uplink tap circuit to provide either a portion of the first uplink signal or a portion of the second uplink signal to the uplink radio frequency detector circuit;
   a first downlink amplification path that includes a first downlink tap circuit, the first downlink amplification path coupled between the first port and the second port and configured to pass a first downlink signal of a third frequency in the wireless communication network;
   a second downlink amplification path that includes a second downlink tap circuit, the second downlink amplification path coupled between the first port and the second port and configured to pass a second downlink signal of a fourth frequency in the wireless communication network;
   a downlink radio frequency detector circuit; and
   a downlink switch circuit coupled to the first downlink tap circuit, to the second downlink tap circuit, and to the downlink radio frequency detector circuit, the downlink switch circuit configured to switch between coupling the downlink radio frequency detector circuit to the first downlink tap circuit and coupling the downlink radio frequency detector circuit to the second downlink tap circuit to provide either a portion of the first downlink signal or a portion of the second downlink signal to the downlink radio frequency detector circuit.

2. The signal booster of claim 1, wherein each of the first uplink tap circuit, the second uplink tap circuit, the first downlink tap circuit, and the second downlink tap circuit include one or more of a resistor, a splitter, a capacitor, and a directional coupler.

3. The signal booster of claim 1, wherein the uplink radio frequency detector circuit and the downlink radio frequency detector circuit each include one or more of a diode and a log detector.

4. The signal booster of claim 1, further comprising a control unit coupled to the uplink switch circuit, the downlink switch circuit, the uplink radio frequency detector circuit, and the downlink radio frequency detector circuit, wherein the control unit is configured to control the uplink switch circuit and the downlink switch circuit, to receive a uplink output from the uplink radio frequency detector circuit, and to receive a downlink output from the downlink radio frequency detector circuit.

5. The signal booster of claim 4, wherein the control unit is configured to:
adjust a first uplink amplification applied to the first uplink signal in the first uplink amplification path and a second uplink amplification applied to the second uplink signal in the second uplink amplification path based on the uplink output from the uplink radio frequency detector circuit, and
adjust a first downlink amplification applied to the first downlink signal in the first downlink amplification path and a second downlink amplification applied to the second downlink signal in the second downlink amplification path based on the downlink output from the downlink radio frequency detector circuit.

6. A signal booster, comprising:
a first port;
a second port;
a first amplification path that includes a first tap circuit, the first amplification path coupled between the first port and the second port and configured to amplify a first signal in a wireless communication network;
a second amplification path that includes a second tap circuit, the second amplification path coupled between the first port and the second port and configured to amplify a second signal in the wireless communication network;
a radio frequency detector circuit; and
a switch circuit coupled to the first tap circuit, to the second tap circuit, and to the radio frequency detector circuit, the switch circuit configured to switch between coupling the radio frequency detector circuit to the first tap circuit and coupling the radio frequency detector circuit to the second tap circuit to provide either a portion of the first signal or a portion of the second signal to the radio frequency detector circuit.

7. The signal booster of claim 6, wherein each of the first tap circuit and the second tap circuit include one or more a resistor, a splitter, a capacitor, and a directional coupler.

8. The signal booster of claim 6, wherein the radio frequency detector circuit includes one or more of a diode and a log detector.

9. The signal booster of claim 6, wherein the first signal is a first first-direction signal, the first amplification path is a first first-direction amplification path, the second signal is a second first-direction signal and the second amplification path is a second first-direction amplification path.

10. The signal booster of claim 6, wherein the first signal is an uplink signal, the first amplification path is an uplink amplification path, the second signal is a downlink signal and the second amplification path is a downlink amplification path.

11. The signal booster of claim 10, wherein uplink signal and the downlink signal are part of a same communication frequency band in the wireless communication network.

12. The signal booster of claim 6, further comprising a control unit coupled to the switch circuit and the radio frequency detector circuit, the control unit configured to control the switch circuit and to receive an output from the radio frequency detector circuit.

13. The signal booster of claim 12, wherein the control unit is configured to adjust a first amplification applied to the first signal in the first amplification path and a second amplification applied to the second signal in the second amplification path based on the output from the radio frequency detector circuit.

14. The signal booster of claim 12, wherein the switch circuit is a first switch circuit, the signal booster further comprising a second switch circuit coupled between the first switch circuit and the first tap circuit, wherein the control unit is configured to control the second switch circuit such that the second switch circuit is closed only when the first switch circuit is coupled to the first tap circuit.

15. The signal booster of claim 6, wherein the first amplification path is a first uplink amplification path, the first tap circuit is a first uplink tap circuit, the second amplification path is a second uplink amplification path, the second tap circuit is a second uplink tap circuit, the switch circuit is a first switch circuit, and the radio frequency detector circuit is a first radio frequency detector circuit,
wherein the signal booster further comprises:
a first downlink amplification path that includes a first downlink tap circuit, the first downlink amplification path coupled between the first port and the second port;
a second downlink amplification path that includes a second downlink tap circuit, the second downlink amplification path coupled between the first port and the second port;
a second radio frequency detector circuit; and
a second switch circuit coupled to the first downlink tap circuit, to the second downlink tap circuit, and to second radio frequency detector circuit, the second switch circuit configured to switch between coupling the second radio frequency detector circuit to the first downlink tap circuit and coupling the second radio frequency detector circuit to the second downlink tap circuit.

16. A method, comprising:
amplifying a first signal in a first amplification path coupled between a first port and a second port of a signal booster;
amplifying a second signal in a second amplification path coupled between the first port and the second port of the signal booster;
coupling a radio frequency detector to the first amplification path to detect a power level of the first signal;
decoupling the radio frequency detector from the first amplification path; and
coupling the radio frequency detector to the second amplification path to detect a power level of the second signal.

17. The method of claim 16, wherein decoupling the radio frequency detector from the first amplification path and coupling the radio frequency detector to the second amplification path occurs while the first signal is amplified by the first amplification path.

18. The method of claim 16, wherein the first signal is a first first-direction signal, the first amplification path is a first first-direction amplification path, the second signal is a second first-direction signal and the second amplification path is a second first-direction amplification path.

19. The method of claim 16, wherein the first signal is a first-direction signal, the first amplification path is a first-direction amplification path, the second signal is a second-direction signal and the second amplification path is a second-direction amplification path.

20. The method of claim 16, further comprising:
controlling the amplification of the first signal in the first amplification path based on the power level of the first signal; and
controlling the amplification of the second signal in the second amplification path based on the power level of the second signal.

\* \* \* \* \*